(12) United States Patent
Basker et al.

(10) Patent No.: US 8,999,795 B2
(45) Date of Patent: Apr. 7, 2015

(54) ASYMMETRICAL REPLACEMENT METAL GATE FIELD EFFECT TRANSISTOR

(71) Applicant: International Business Machines Corporation, Armonk, NY (US)

(72) Inventors: Veeraraghavan S. Basker, Schenectady, NY (US); Tenko Yamashita, Schenectady, NY (US); Chun-Chen Yeh, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 44 days.

(21) Appl. No.: 13/964,405

(22) Filed: Aug. 12, 2013

(65) Prior Publication Data

US 2015/0024558 A1    Jan. 22, 2015

Related U.S. Application Data

(63) Continuation of application No. 13/945,076, filed on Jul. 18, 2013.

(51) Int. Cl.
*H01L 21/336* (2006.01)
*H01L 21/425* (2006.01)
*H01L 29/66* (2006.01)

(52) U.S. Cl.
CPC .... *H01L 29/66492* (2013.01); *H01L 29/66545* (2013.01); *H01L 29/66659* (2013.01)

(58) Field of Classification Search
CPC ............ H01L 21/0251; H01L 21/823412; H01L 21/823418; H01L 21/823807; H01L 21/823814; H01L 21/311; H01L 21/31105; H01L 21/31127; H01L 21/31144; H01L 21/3115; H01L 21/31155; H01L 29/66545; H01L 29/6656; H01L 29/66598; H01L 21/66659
USPC .................. 438/231, 286, 303, 305, 306, 527
See application file for complete search history.

(56) References Cited

U.S. PATENT DOCUMENTS

| | | | |
|---|---|---|---|
| 4,956,314 A | 9/1990 | Tam et al. | |
| 5,830,788 A * | 11/1998 | Hiroki et al. | 438/199 |
| 6,168,999 B1 * | 1/2001 | Xiang et al. | 438/286 |
| 6,291,325 B1 * | 9/2001 | Hsu | 438/525 |
| 6,344,396 B1 | 2/2002 | Ishida et al. | |
| 6,509,241 B2 | 1/2003 | Park et al. | |
| 6,534,787 B1 * | 3/2003 | Hsu | 257/66 |

(Continued)

OTHER PUBLICATIONS

Cheng et al., "Exploration of Velocity Overshoot in a High-Performance Deep Sub-0.1-um SOI MOSFET with Asymmetric Channel Profile", IEEE Electron Device Letters, vol. 20, No. 10, Oct. 1999, pp. 538-540.

(Continued)

*Primary Examiner* — Fernando L Toledo
*Assistant Examiner* — Christine C Lau
(74) *Attorney, Agent, or Firm* — Cantor Colburn LLP; Vazken Alexanian (57) ABSTRACT

An asymmetrical field effect transistor (FET) device includes a semiconductor substrate, a buried oxide layer disposed on the semiconductor substrate, an extended source region disposed on the buried oxide layer and a drain region disposed on the buried oxide layer. The asymmetrical FET device also includes a silicon on insulator region disposed between the extended source region and the drain region and a gate region disposed above the extended source region and the silicon on insulator region.

13 Claims, 6 Drawing Sheets

(56) References Cited

U.S. PATENT DOCUMENTS

| | | | |
|---|---|---|---|
| 6,794,256 | B1 | 9/2004 | Fuselier et al. |
| 6,982,216 | B1 * | 1/2006 | Yamashita .................... 438/525 |
| 7,863,136 | B2 | 1/2011 | Goldbach et al. |
| 8,574,991 | B2 * | 11/2013 | Hoentschel et al. .......... 438/286 |
| 8,669,160 | B2 * | 3/2014 | Yin et al. ..................... 438/286 |
| 8,728,926 | B2 * | 5/2014 | Hong ............................ 438/595 |
| 2010/0148217 | A1 | 6/2010 | Simonelli et al. |
| 2011/0108930 | A1 | 5/2011 | Cheng et al. |
| 2012/0007145 | A1 | 1/2012 | Chen et al. |
| 2012/0223386 | A1 | 9/2012 | Cheng et al. |

OTHER PUBLICATIONS

Dehan et al., "An asymmetric channel SOI nMOSFET for improving DC and microwave characteristics", Solid-State Electronics, vol. 46, Issue 7, Jul. 2002, pp. 1005-1011.

Fung et al., "45nm SOI CMOS Technology with 3X Hole Mobility Enhancement and Asymmetric Transistor for High Performance CPU Application." IEEE International Electron Devices Meeting, IEDM, Dec. 10-12, 2007, pp. 1035-1037.

Ghani et al., "Asymmetric Source/Drain Extension Transistor Structure for High Performance Sub-50 nm Gate Length CMOS Devices," Symposium on VLSI Technology, Jun. 12-14, 2001, pp. 17-18.

Goel et al., "Asymmetric Drain Spacer Extension (ADSE) FinFETs for Low-Power and Robust SRAMs,", IEEE Transactions on Electron Devices, vol. 58, No. 2; Jan. 20, 2011, pp. 296-308.

Hoentschel et al., "Implementation and Optimization of Asymmetric Transistors in Advanced SOI CMOS Technologies for High Performance Microprocessors," IEEE International Electron Devices Meeting, IEDM, Dec. 15-17, 2008, 4 pages.

Odanaka et al., "Potential Design and Transport Property of 0.1-um MOSFET with Asymmetric Channel Profile", IEEE Transactions on Electron Devices, vol. 44, No. 4, Apr. 1997, pp. 595-600.

* cited by examiner

ASYMMETRICAL REPLACEMENT METAL GATE FIELD EFFECT TRANSISTOR

This application is a continuation application of the legally related U.S. Ser. No. 13/945,076, filed Jul. 18, 2013, the contents of which are incorporated by reference herein in their entirety.

BACKGROUND

The present invention relates generally to semiconductor fabrication and more specifically to, the fabrication of field effect transistors (FETs) having an asymmetrical structure.

In a typical replacement gate process for manufacturing a FET, a dummy gate is lithographically formed on the substrate, spacers are formed on the sidewalls of the dummy gate, and a dielectric is deposited to cover the gates and fill the areas between gates. The dielectric is then polished or etched back so as to be co-planar with the dummy gate. Then the dummy gate is removed leaving an opening in the dielectric. Within the opening, a gate dielectric is deposited and the remainder of the opening is over-filled with gate material. The structure is then polished so that the gate material in the opening and the dielectric are co-planar.

The drive for high performance requires high speed operation of microelectronic components requiring high drive currents in addition to low leakage, i.e., low off-state current, to reduce power consumption. In conventional transistor technologies, the source/drain extensions may overlap the gate region of the device. This overlap causes overlap capacitance in the device. In general, the greater the overlap of the source/drain extensions with the gate region, the greater the overlap capacitance is. In current FET configurations, the amount of overlap of a source extension with a gate region is approximately equal to the amount of overlap of a drain region extension with the gate region.

SUMMARY

According to one embodiment, a method for fabricating an asymmetrical field effect transistor device includes forming semiconductor structure having a substrate layer, a buried oxide (BOX) layer, a semiconductor-on-insulator (SOI) layer having a source and a drain region, a dummy gate on the SOI layer and an offset spacer disposed around the dummy gate, removing at least a portion of the offset spacer and the dummy gate to expose a portion of the SOI layer and depositing a liner layer over the portion of the SOI layer and the offset spacer. The method also includes implanting ions into a first portion of the liner layer, depositing an oxide film on a second portion of the liner layer, and removing the first portion of the liner layer to form a trench between the oxide film and the offset spacer. The method further includes forming an extended source region by implanting dopants in a portion of the SOI layer disposed beneath the trench, removing the oxide film and the second portion of the liner layer, and depositing a high-k layer on exposed portions of the extend source region, the offset spacer, the spacer layer and the nitride layer. The method also includes depositing a metal gate layer over the high-k layer and forming a contact metal layer over the metal gate layer.

According to another embodiment, a method for fabricating an asymmetrical field effect transistor device includes forming semiconductor structure having a substrate layer, a buried oxide (BOX) layer, a semiconductor-on-insulator (SOI) layer, forming a dummy gate on the SOI layer and an offset spacer disposed around the dummy gate, andgrowing an epitaxial silicon region on one or more exposed portions of the SOI layer adjacent to the offset spacer. The method also includes depositing a spacer layer on the epitaxial silicon regions and the offset spacer, removing a portion of the spacer layer disposed above the epitaxial silicon, and forming a source and drain region in the SOI layer. The method further includes depositing a nitride layer over the epitaxial silicon regions, the spacer layer and the offset spacer, removing portions of the dummy gate, the nitride layer, the spacer layer and the offset spacer to expose the dummy gate, and removing the dummy gate. The method also includes depositing a liner layer over an exposed portion of the SOI layer, the offset spacer, the spacer layer, and the nitride layer, implanting ions into a first portion of the liner layer, and depositing an oxide film on a second portion of the liner layer that was not implanted with ions. The method further includes forming a trench between the oxide film and the offset spacer by removing the first portion of the liner layer, forming an extended source region by implanting dopants in an area of the SOI layer beneath the trench, and removing the oxide film and the second portion of the liner layer. The method also includes depositing a high-k layer on exposed portions of the extend source region, the offset spacer, the spacer layer and the nitride layer, depositing a metal gate layer over the high-k layer, and forming a contact metal layer over the metal gate layer.

According to yet another embodiment, a asymmetrical field effect transistor device includes An asymmetrical field effect transistor (FET) device includes a semiconductor substrate, a buried oxide layer disposed on the semiconductor substrate, an extended source region disposed on the buried oxide layer and a drain region disposed on the buried oxide layer. The asymmetrical FET device also includes a silicon on insulator region disposed between the extended source region and the drain region and a gate region disposed above the extended source region and the silicon on insulator region.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Figure 1A:
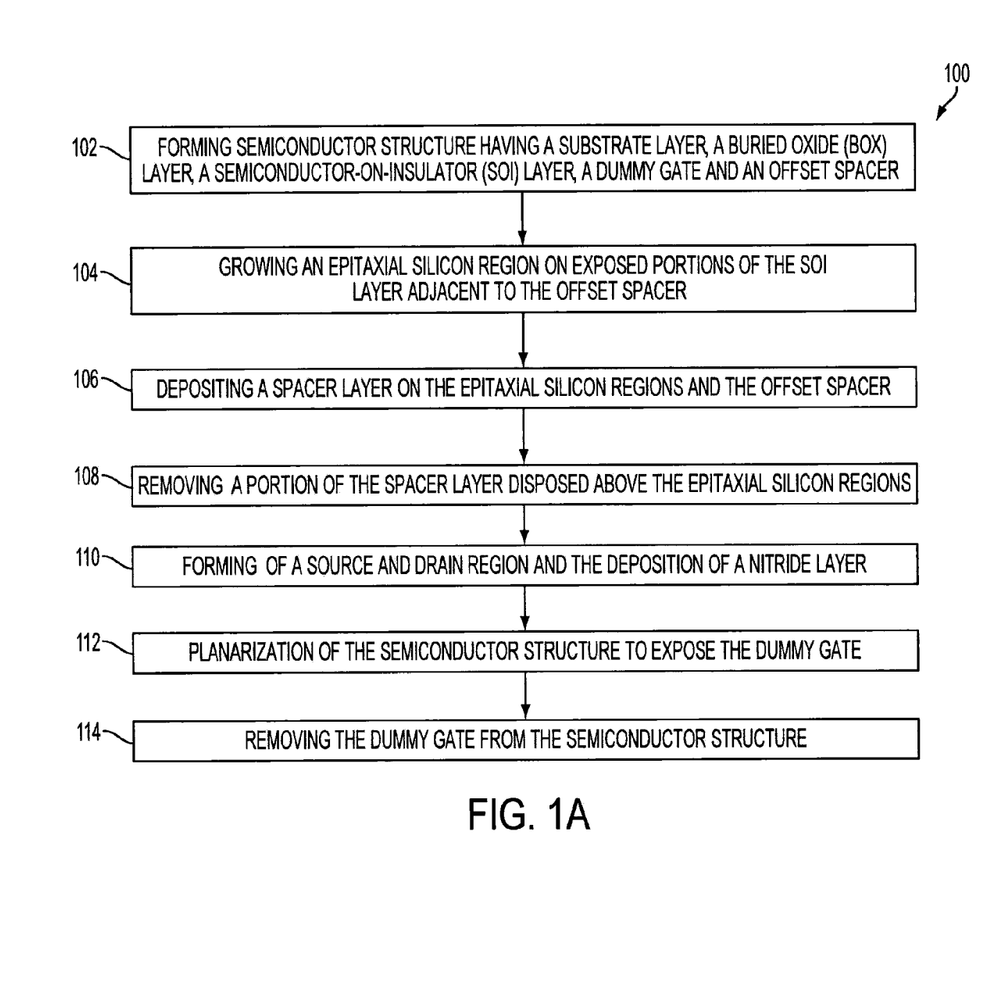
FIGS. 1A and 1B are flow chart diagrams illustrating a method for forming field effect transistors (FETs) having an asymmetrical structure in accordance with an exemplary embodiment.
Figure 1B:
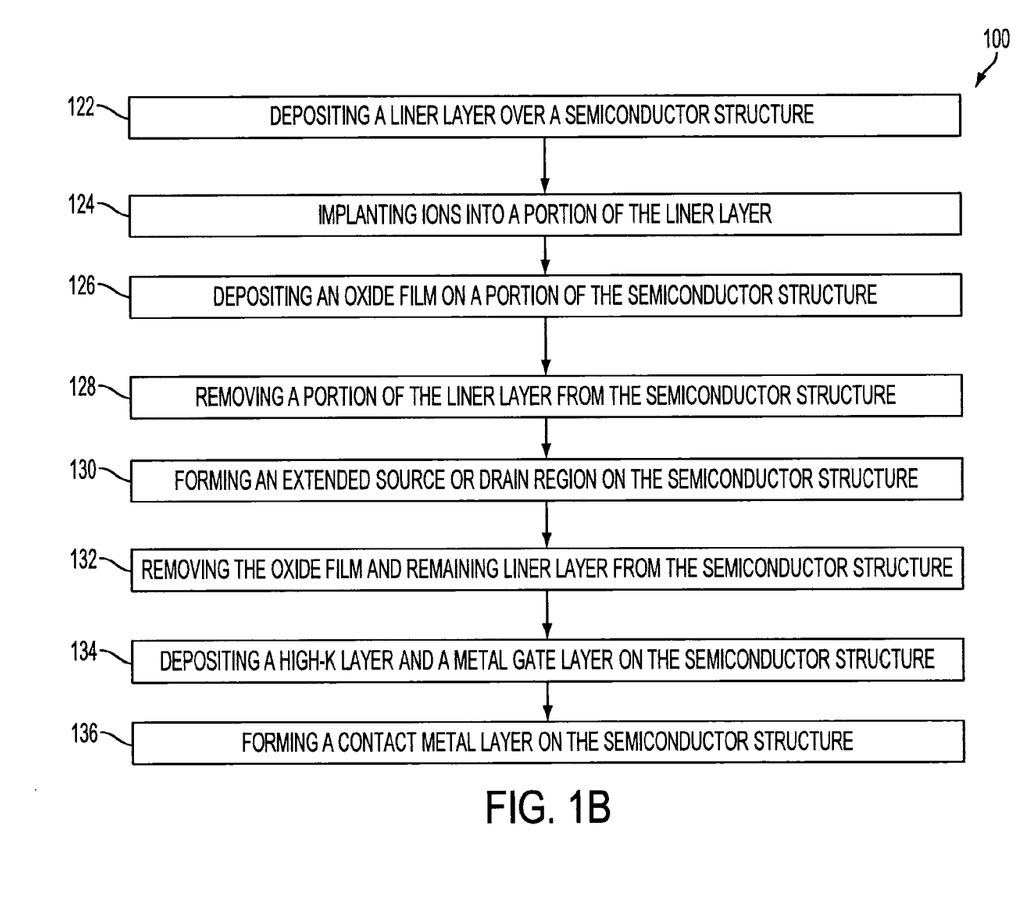

FIGS. 1A and 1B are flow chart diagrams illustrating a method for forming a field effect transistor (FET) having an asymmetrical structure in accordance with an exemplary embodiment. In exemplary embodiments, the asymmetrical structure of the FET includes a source and drain region which have different amount of overlap with a gate region. FIGS. 2-16 illustrate a semiconductor structure at different steps in a process of forming an FET having an asymmetrical structure in accordance with an exemplary embodiment.

In exemplary embodiment, the method of forming the asymmetrical FET may be applied to a planar FET or a non-planar FET (i.e., finFET or Trigate transistor). A planar FET is an FET in which the current flow is in the same plane as the substrate. A non-planar FET is a device which includes a fin protruding out of the wafer (substrate) plane and a gate wrapped around the three sides of the protruding fin. The current flows vertically along the sides of the fin (perpendicular to the plane of the substrate), thus the current flow is out of plane (non-planar).

Referring to FIG. 1A, a flow chart diagram illustrating a method 100 for forming a FET having an asymmetrical structure in accordance with an exemplary embodiment is shown. As shown at block 102 and in FIG. 2, the method 100 begins by forming semiconductor structure having a substrate layer, a buried oxide (BOX) layer, a semiconductor-on-insulator (SOI) layer, a dummy gate and an offset spacer. Next, as shown at block 104 and in FIG. 3, the method includes growing an epitaxial silicon region on exposed portions of the SOI layer adjacent to the offset spacer. As shown at block 106 and in FIG. 4, the method 100 also includes depositing a spacer layer on the epitaxial silicon regions and the offset spacer. The method 100 also includes removing a portion of the spacer layer disposed above the epitaxial silicon regions, as shown at block 108 and in FIG. 5. Next, as shown at block 110 and in FIG. 6, the method 100 includes formation of a source and drain region and the deposition of a nitride layer. The method 100 also includes planarization of the semiconductor structure to expose the dummy gate, as shown at block 112 and in FIG. 7. Next, as shown at block 114 and in FIG. 8, the method 100 includes removing the dummy gate from the semiconductor structure.

Referring to FIG. 1B, a flow chart diagram illustrating a method 120 for forming a FET having an asymmetrical structure in accordance with an exemplary embodiment is shown. As shown at block 122 and in FIG. 9, the method 120 begins by depositing a liner layer over a semiconductor structure shown in FIG. 8. The method 120 also includes implanting ions into a portion of the liner layer, as shown at block 124 and in FIG. 10. Next, as shown at block 126 and in FIG. 11, the method 120 includes deposition of an oxide film on a portion of the semiconductor structure. The method 120 also includes removal of a portion of the liner layer from the semiconductor structure, as shown at block 128 and in FIG. 12. Next, as shown at block 130 and in FIG. 13, the method 120 includes formation of an extended source or drain region on the semiconductor structure. The method 120 also includes removal of the oxide film and remaining liner layer from the semiconductor structure, as shown at block 132 and in FIG. 14. Next, as shown at block 134 and in FIG. 15, the method 120 includes deposition of high-k layer and a metal gate layer on the semiconductor structure. The method 120 also includes formation of a contact metal layer on the semiconductor structure, as shown at block 136 and in FIG. 16.

Figure 2:
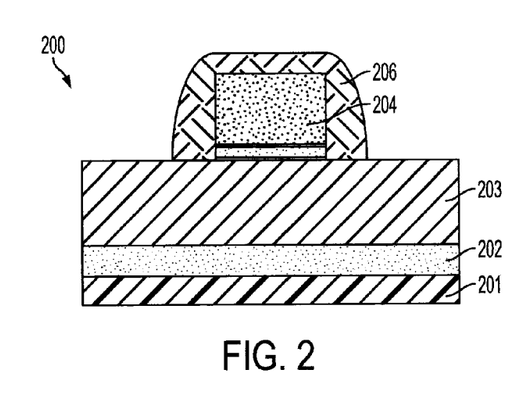
FIG. 2 is a cross sectional view of a semiconductor structure which serves as a starting point for the fabrication of a FET having an asymmetrical structure in accordance with an exemplary embodiment.

Referring now to FIG. 2, a semiconductor structure 200 which serves as a starting point for fabrication of a FET having an asymmetrical structure in accordance with an exemplary embodiment is shown. In exemplary embodiments, the semiconductor structure 200 includes a semiconductor substrate 201, a buried oxide (BOX) layer 202 disposed on the semiconductor substrate 201 and a semiconductor-on-insulator (SOI) layer 203 disposed on the BOX layer 202. In exemplary embodiments, the semiconductor structure 200 also includes a dummy gate stack 204 disposed on the SOI layer 203 and an offset spacer disposed around the dummy gate stack 204.

In exemplary embodiments, the semiconductor substrate 201 may be formed from various semiconductor materials. For example, the semiconductor substrate 202 may be formed from silicon (Si), germanium (Ge), silicon germanium (SiGe), silicon carbide (SiC), or a III-V compound semiconductor (e.g., GaAs), and a II-VI compound semiconductors (e.g., ZnSe). In addition, a semiconductor substrate 201, or a portion thereof, may be amorphous, polycrystalline, or single-crystalline. The semiconductor substrate 201 may be doped, undoped or contain doped regions and undoped regions therein. Further, the semiconductor substrate 201 may be strained, unstrained, contain regions of strain and no strain therein, or contain regions of tensile strain and compressive strain.

Figure 3:
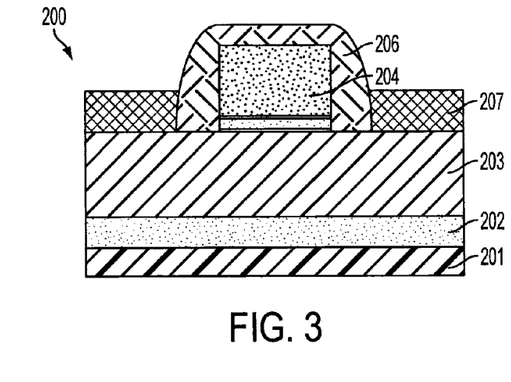
FIG. 3 illustrates the growth of an epitaxial silicon region on the structure of FIG. 2 in accordance with an exemplary embodiment.

Referring now to FIG. 3, the semiconductor structure 200 is shown after epitaxial silicon regions 207 are grown on the exposed portions of the SOI layer 203. In exemplary embodiments, the epitaxial silicon regions 207 are grown above portions of the SOI layer 203 adjacent to the offset spacer 206.

Figure 4:
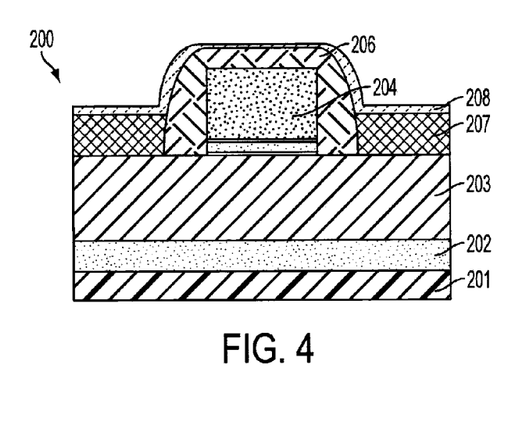
FIG. 4 illustrates depositing a spacer layer on the structure of FIG. 3 in accordance with an exemplary embodiment.

Referring now to FIG. 4, the semiconductor structure 200 is shown after a spacer layer 208 is deposited on the semiconductor structure 200. In exemplary embodiments, the spacer layer 208 is deposited over both the epitaxial silicon regions 207 and the offset spacer 206.

Figure 5:
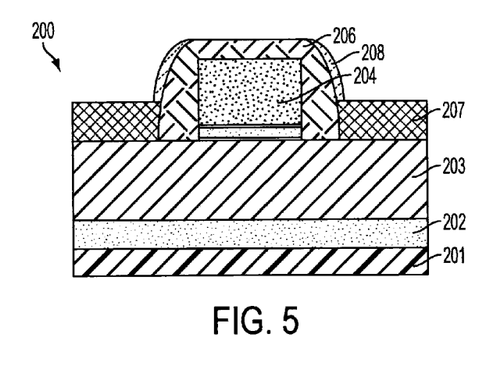
FIG. 5 illustrates the removal of a portion of the spacer layer from the structure of FIG. 4 in accordance with an exemplary embodiment.

Referring now to FIG. 5, the semiconductor structure 200 is shown after a portion of the spacer layer 208 is removed from the semiconductor structure 200. In exemplary embodiments, the portion of the spacer layer 208 that is disposed over the epitaxial silicon regions 207 is removed. In exemplary embodiments, the portion of the spacer layer 208 may be removed by a reactive ion etching (RIE) process, or the like.

Figure 6:
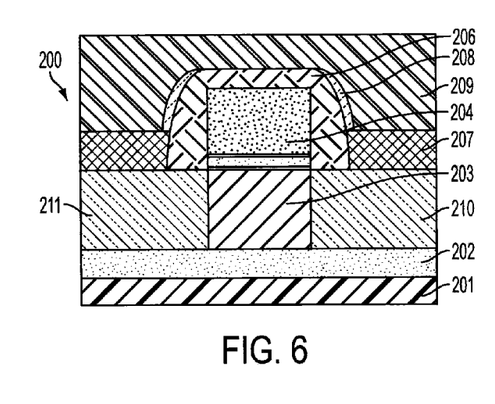
FIG. 6 illustrates the formation of a source and drain region and depositing a nitride layer on the structure of FIG. 5 in accordance with an exemplary embodiment.

Referring now to FIG. 6, the semiconductor structure 200 is shown after the formation of a source region 210 and a drain region 211 and after a nitride layer 209 is deposited on the semiconductor structure of FIG. 5. In exemplary embodiments, the source region 210 and the drain region 211 may be formed by implanting dopants into the source region 210 and the drain region 211. In exemplary embodiments, the remaining portion of the spacer layer 208 and the offset spacer 206 protect the dummy gate stack 204 and portions of the SOI layer 203 from the implantation of the dopants. In exemplary embodiments, the source and drain regions may be formed by implanting dopants using, for example, an ion implantation process performed following the epitaxial growth process that grows, for example, an epi SiGe(B) on the PFET side, epi Si(P) in the nFET side in a complimentary metal oxide semiconductor (CMOS) compatible flow.

Figure 7:
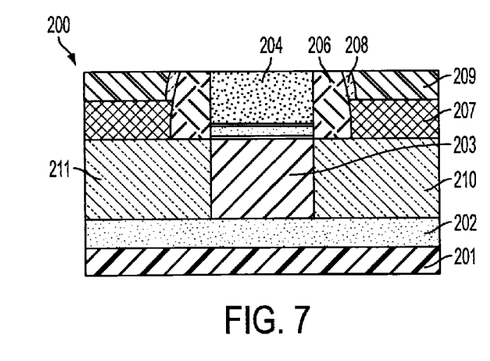
FIG. 7 illustrates the planarization of the structure of FIG. 6 in accordance with an exemplary embodiment.

Referring now to FIG. 7, the semiconductor structure 200 is shown after the planarization of the semiconductor structure of FIG. 6. In exemplary embodiments, the planarization may include a chemical mechanical polishing (CMP) process which removes a portion of the nitride layer 209, the spacer layer 208 and the offset spacer 206 to expose the dummy gate stack 204. In exemplary embodiments, the planarization may also include removing a portion of the dummy gate stack 204.

Figure 8:
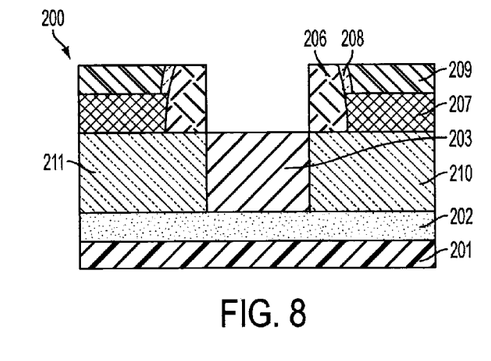
FIG. 8 illustrates the removal of a dummy gate from the structure of FIG. 7 in accordance with an exemplary embodiment.

Referring now to FIG. 8, the semiconductor structure 200 is shown after the removal of the dummy gate stack 204 from the semiconductor structure of FIG. 7. In exemplary embodiments, the dummy gate stack 204 may be removed by a wet etch or another suitable chemical oxide removal (COR) process.

Figures 9, 11:
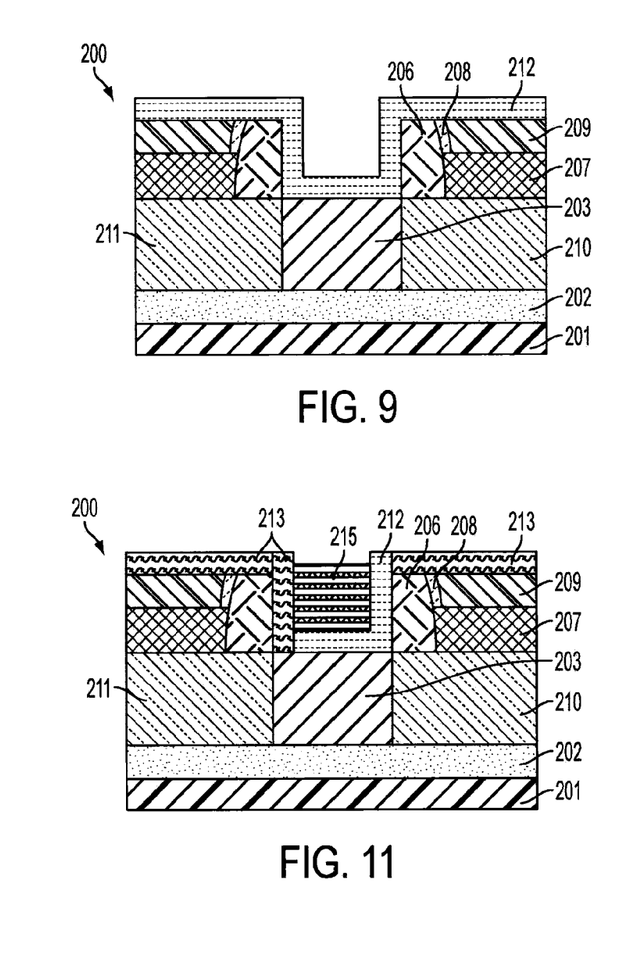
FIG. 9 illustrates the deposition of a liner layer on the semiconductor structure of FIG. 8 in accordance with an exemplary embodiment.
FIG. 11 illustrates the deposition of an oxide film on a portion of the structure of FIG. 10 in accordance with an exemplary embodiment.

Referring now to FIG. 9, the semiconductor structure 200 is shown after the deposition of a liner layer 212 on the semiconductor structure of FIG. 8. In exemplary embodiments, the liner layer 212 may be a layer of silicon nitride that is disposed on the semiconductor structure 200 to cover the exposed portions of the nitride layer 209, the spacer layer 208 and the offset spacer 206 and the SOI layer 203.

Figures 10, 12:
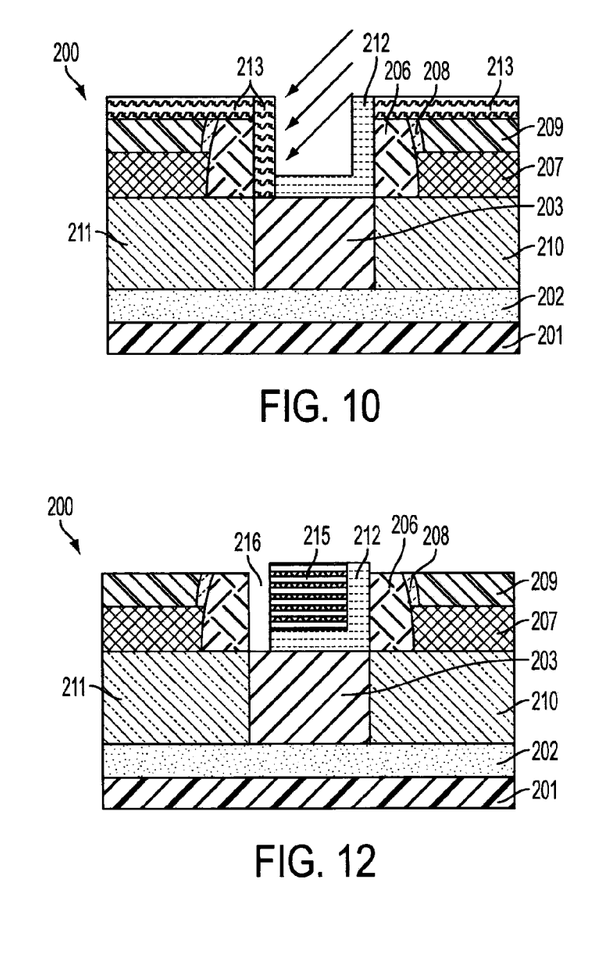
FIG. 10 illustrates ion implantation on a portion of the liner layer of the structure of FIG. 9 in accordance with an exemplary embodiment.
FIG. 12 illustrates the removal of a portion of the liner layer from the structure of FIG. 11 in accordance with an exemplary embodiment.

Referring now to FIG. 10, the semiconductor structure 200 is shown after implantation of ions into a portion of the liner layer 212 of the semiconductor structure of FIG. 9. In exemplary embodiments, the ion implantation process is configured to implant ions at an angle that is not normal to the surface of the semiconductor structure 200. By implanting the ions at an angle, for example forty-five degrees from normal to the surface of the semiconductor structure 200, a first portion of the liner layer 213 will be implanted with ions while other portions of the liner layer 212 will not be implanted with ions. In exemplary embodiments, the angle of implantation may be configured based on the relative width and depth of a recess 214 formed above the SOI layer 203 in between the source region 210 and the drain region 211.

Referring now to FIG. 11, the semiconductor structure 200 is shown after the deposition of an oxide film 215 on a portion of the semiconductor structure of FIG. 10. In exemplary embodiments, the oxide film 215 is deposited in the recess 214.

Referring now to FIG. 12, the semiconductor structure 200 is shown after the removal of a portion of the liner layer 212 from the semiconductor structure of FIG. 11. In exemplary embodiments, the portion of the liner layer 212 that is removed is the first portion of the liner layer 213 which was implanted with ions as shown in FIG. 10. In exemplary embodiments, the removal of the first portion of the liner layer 213 forms a trench 216 between the offset spacer 206 and the oxide film 215 and exposes a portion of the SOI layer 203.

Figure 13:
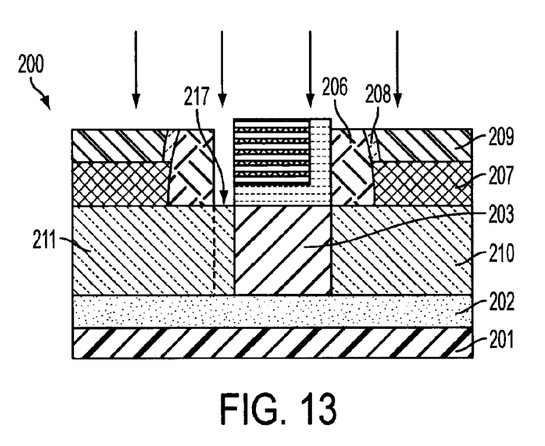
FIG. 13 illustrates the formation of an extended source region on the structure of FIG. 12 in accordance with an exemplary embodiment.

Referring now to FIG. 13, the semiconductor structure 200 is shown after the formation of an extended source region 217 on the semiconductor structure of FIG. 12. In exemplary embodiments, the extended source region 217 is formed by implanting dopants into the exposed area of the SOI layer 203 beneath the trench 216. In exemplary embodiments, the portions of the SOI layer 203 beneath the oxide film 215 and the remaining liner layer 212 are protected from the implantation process by the oxide film 215 and the liner layer 212. Although the illustration and accompanying description show the formation of and extended source region, it will be clear to those of ordinary skill in the art that the same methods may be used to form an extended drain region.

Figure 14:
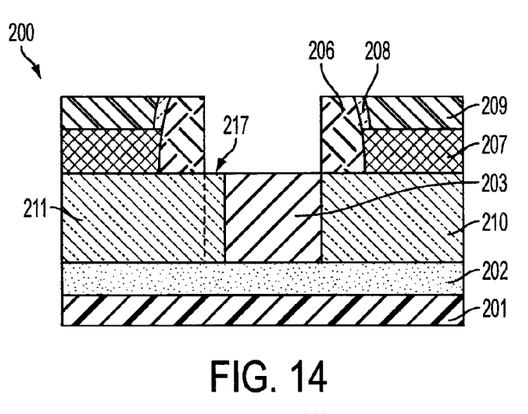
FIG. 14 illustrates the removal of the oxide film and remaining liner layer from the structure of FIG. 13 in accordance with an exemplary embodiment.

Referring now to FIG. 14, the semiconductor structure 200 is shown after the removal of the oxide film 215 and remaining liner layer 212 from the semiconductor structure of FIG. 13. In exemplary embodiments, the oxide film 215 and remaining liner layer 212 may be removed by a diluted HF, and the silicon nitride liner can be removed by hot Phosphoric acid.

Figure 15:
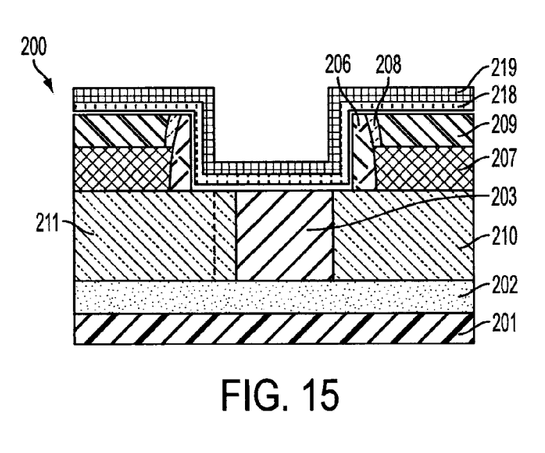
FIG. 15 illustrates the deposition of high-k layer and a metal gate layer on the structure of FIG. 14 in accordance with an exemplary embodiment.

Referring now to FIG. 15, the semiconductor structure 200 is shown after the deposition of high-k layer 218 and a metal gate layer 219 on the semiconductor structure of FIG. 14. In exemplary embodiments, the high-k layer 218 includes a material with a high dielectric constant; such material may include, but are not limited to, hafnium silicate, zirconium silicate, hafnium dioxide and zirconium dioxide. In exemplary embodiments, the metal gate layer 219 may include titanium carbide, titanium nitride, or any other suitable material.

Figure 16:
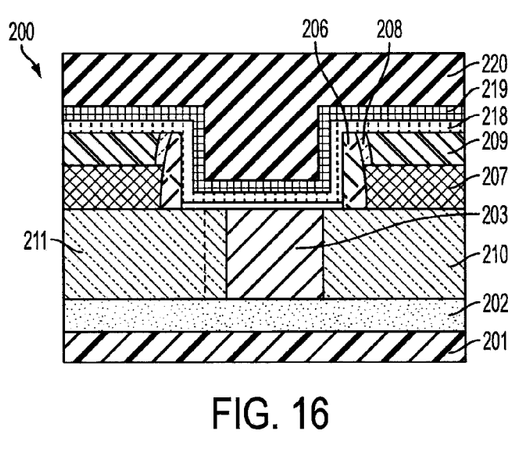
FIG. 16 illustrates the formation of a contact metal layer on the structure of FIG. 15 in accordance with an exemplary embodiment.

Referring now to FIG. 16, the semiconductor structure 200 is shown after the formation of a contact metal layer 220 on the semiconductor structure of FIG. 15. In exemplary embodiments, the contact metal layer 220 may be a layer of tungsten or another suitable material. In exemplary embodiments, the high-k layer 218, the metal gate layer 219 and the contact metal layer 220 are deposited across the surface of the semiconductor structure 200 including in a gate region 222 disposed above the SOI layer 203 and the extended source region 217. From this point, additional processing may continue as known in the art.

In exemplary embodiments, one benefit of making asymmetrical FET is mainly the overlap capacitance reduction. As the device continuously scales, the parasitic cap increases drastically. If we make the drain side slightly under lap then one can achieve reduced overlap capacitance to alleviate the performance degradation being introduced by the scaling. The DC drive current can have only minimum impact because of the high electric field near the drain side. So overall the net transistor operation frequency (CV/I) can be enhanced.

The methods and resultant structures described herein provide a method the fabrication of FET devices having an asymmetrical structure that include a source and drain region which have different amount of overlap with a gate region.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A method for fabricating an asymmetrical field effect transistor (FET) device, the method comprising:
    forming a semiconductor structure having a substrate layer, a buried oxide (BOX) layer, a semiconductor-on-insulator (SOI) layer having a source and a drain region, a dummy gate on the SOI layer, and an offset spacer disposed around the dummy gate;
    removing at least a portion of the offset spacer and the dummy gate to expose a portion of the SOI layer;
    depositing a liner layer over the portion of the SOI layer and the offset spacer;
    implanting ions into a first portion of the liner layer;
    depositing an oxide film on a second portion of the liner layer;
    removing the first portion of the liner layer to form a trench between the oxide film and the offset spacer;
    forming an extended source region by implanting dopants in a portion of the SOI layer disposed beneath the trench;
    removing the oxide film and the second portion of the liner layer;
    depositing a high-k layer on exposed portions of the extended source region and the offset spacer;
    depositing a metal gate layer over the high-k layer; and
    forming a contact metal layer over the metal gate layer.

2. The method of claim 1, wherein implanting ions into a first portion of the liner layer includes implanting ions at an angle to a surface of the liner layer.

3. The method of claim 2, wherein the angle is approximately forty five degrees offset from normal to the surface of the liner layer.

4. The method of claim 2, wherein removing at least the portion of the offset spacer and the dummy gate to expose the portion of the SOI layer creates a recess.

5. The method of claim 4, wherein the angle is based on a relative width and depth of the recess.

6. The method of claim 1, wherein removing the first portion of the liner layer is performed by wet etching.

7. The method of claim 1, wherein the first portion of the liner layer and the second portion of the liner layer do not overlap.

8. The method of claim 1, wherein the liner layer is a layer of silicon nitride.

9. A method for fabricating an asymmetrical field effect transistor (FET) device, the method comprising:
    forming a semiconductor structure having a substrate layer, a buried oxide (BOX) layer, and a semiconductor-on-insulator (SOI) layer;
    forming a dummy gate on the SOI layer and an offset spacer disposed around the dummy gate;
    growing an epitaxial silicon region on one or more exposed portions of the SOI layer adjacent to the offset spacer;
    depositing a spacer layer on the epitaxial silicon regions and the offset spacer;
    removing a portion of the spacer layer disposed above the epitaxial silicon;
    forming a source and drain region in the SOI layer;
    depositing a nitride layer over the epitaxial silicon regions, the spacer layer and the offset spacer;
    removing portions of the dummy gate, the nitride layer, the spacer layer and the offset spacer to expose the dummy gate;
    removing the dummy gate;
    depositing a liner layer over an exposed portion of the SOI layer, the offset spacer, the spacer layer, and the nitride layer;
    implanting ions into a first portion of the liner layer;
    depositing an oxide film on a second portion of the liner layer that was not implanted with ions;
    forming a trench between the oxide film and the offset spacer by removing the first portion of the liner layer;
    forming an extended source region by implanting dopants in an area of the SOI layer beneath the trench;
    removing the oxide film and the second portion of the liner layer;
    depositing a high-k layer on exposed portions of the extend source region, the offset spacer, the spacer layer and the nitride layer;
    depositing a metal gate layer over the high-k layer; and
    forming a contact metal layer over the metal gate layer.

10. The method of claim 9, wherein implanting ions into a first portion of the liner layer includes implanting ions at an angle to a surface of the liner layer.

11. The method of claim 10, wherein the angle is approximately forty five degrees offset from normal to the surface of the liner layer.

12. The method of claim 9, wherein removing at least the portion of the offset spacer and the dummy gate to expose the portion of the SOI layer creates a recess.

13. The method of claim 12, wherein the angle is based on a relative width and depth of the recess.

* * * * *